(12) United States Patent
Zhou et al.

(10) Patent No.: US 8,351,143 B2
(45) Date of Patent: Jan. 8, 2013

(54) COLOR FILTER SUBSTRATE AND MANUFACTURING METHOD THEREOF

(75) Inventors: Weifeng Zhou, Beijing (CN); Kiyong Kim, Beijing (CN); Jian Guo, Beijing (CN); Xing Ming, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 497 days.

(21) Appl. No.: 12/126,147

(22) Filed: May 23, 2008

(65) Prior Publication Data

US 2009/0130486 A1 May 21, 2009

(30) Foreign Application Priority Data

Nov. 15, 2007 (CN) .......................... 2007 1 0177427

(51) Int. Cl.
*G02B 5/22* (2006.01)
*G03F 1/00* (2006.01)

(52) U.S. Cl. ........................................... 359/891; 430/7
(58) Field of Classification Search .................. None
See application file for complete search history.

(56) References Cited

U.S. PATENT DOCUMENTS

| 3,165,406 A * | 1/1965 | Murray .......................... 430/212 |
| 3,227,554 A * | 1/1966 | Barr et al. ...................... 430/382 |
| 4,271,246 A * | 6/1981 | Sato et al. ......................... 430/7 |
| 5,800,953 A * | 9/1998 | Mizukawa et al. ................ 430/7 |
| 2007/0133007 A1* | 6/2007 | Munnig Schmidt .......... 356/511 |

FOREIGN PATENT DOCUMENTS

| JP | 04-070601 A | 3/1992 |
| JP | 4-106524 A | 4/1992 |
| JP | 07-159610 A | 6/1995 |
| JP | 2000-284110 A | 10/2000 |

* cited by examiner

*Primary Examiner* — Jade R Chwasz
(74) *Attorney, Agent, or Firm* — Ladas & Parry LLP

(57) ABSTRACT

A method of manufacturing a color filter substrate, performed by: preparing a color mask including a cyan transparent layer, a fuchsine transparent layer and a yellow transparent layer; preparing a color sensitive material substrate including a red sensitive emulsion cyan layer, a green sensitive emulsion fuchsine layer and a blue sensitive emulsion yellow layer; exposing the color sensitive material substrate using the color mask; and performing processes of development, bleaching, fixation and stabilization on the color sensitive material substrate.

6 Claims, 5 Drawing Sheets

COLOR FILTER SUBSTRATE AND MANUFACTURING METHOD THEREOF

BACKGROUND OF THE INVENTION

The invention relates to a color filter substrate and a manufacturing method thereof.

Liquid crystal displays (LCDs) have the advantages, such as small volume, low power consumption, no radiation, and relatively low product cost. LCDs have experienced a fast development in recent ten years, and there are great progresses either in the size of the screen and/or in the display quality. With the development of LCDs, the competition between the manufacturers is becoming fierce. As the manufacturers enhance the product performance continuously, they also try to decrease the product cost so as to enhance the competition power.

A color filter substrate is a main component and important for a LCD, and the quality and the cost of the color filter substrate directly exert an influence on the quality and the cost of a LCD. Therefore, enhancing quality of a color filter substrate and decreasing cost of a color filter substrate are the main development directions for the manufacturers. Decreasing product cost of a color filter substrate mainly includes decreasing the numbers of processes, decreasing the times for lithography, increasing the produce efficient, and the like.

Currently, in producing a color filter substrate, a four-step lithography process may be employed. In the four-step lithography process, four cycles of film making, lithography, and etching processes are performed, so as to prepare a black matrix, a red pixel region, a green pixel region, and a blue pixel region on a substrate. Finally, for example, indium tin oxide (ITO) is deposited on the substrate, and the color filter substrate is prepared. The specific processes are described as follows.

First, a layer of chromium oxide (CrOx) thin film or chromium (Cr) thin film as the material for the black matrix is deposited on a glass substrate, and then a layer of photoresist is applied on the thin film. Then, the pattern transferring from a mask to the photoresist is completed through a lithography process, and then the desired pattern is formed on the CrOx thin film or Cr thin film by the etching and lifting-off processes (the black matrix is formed in this step). Through three "deposition-lithography-etching" processes, red (RGB: 255, 0, 0), green (RGB: 0, 255, 0), and blue (RGB: 0, 0, 255) patterns are formed on the glass substrate, and finally with depositing an indium tin oxide (ITO) thin film as a common electrode, the traditional color filter substrate is prepared. The different methods for forming the color resin films can be classified as dying method, electrophoretic deposition method, dye dispersion method, printing method, and the like.

The conventional method of preparing a color filter substrate includes four cycles of film forming, lithography, and etching processes, which is of relatively low product efficiency and relatively high product cost. Meantime, since dye distribution uniformity is limited, the conventional method for forming the color resin films is difficult to obtain stability of color in mass production.

SUMMARY OF THE INVENTION

An embodiment of the invention provides a method of manufacturing a color filter substrate, comprising: preparing a color mask including a cyan transparent layer, a fuchsine transparent layer and a yellow transparent layer; preparing a color sensitive material substrate including a red sensitive emulsion cyan layer, a green sensitive emulsion fuchsine layer and a blue sensitive emulsion yellow layer; exposing the color sensitive material substrate using the color mask; performing processes of development, bleaching, fixation and stabilization on the color sensitive material substrate.

Another embodiment of the invention provides a color filter substrate, comprising: a second substrate; three light sensitive emulsion layer, formed on the second substrate sequentially; and three transparent regions formed by exposing, development, bleaching, fixation and stabilization processes, respectively, and each transparent region only allowing to transmit the light in one color.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

Figure 1:
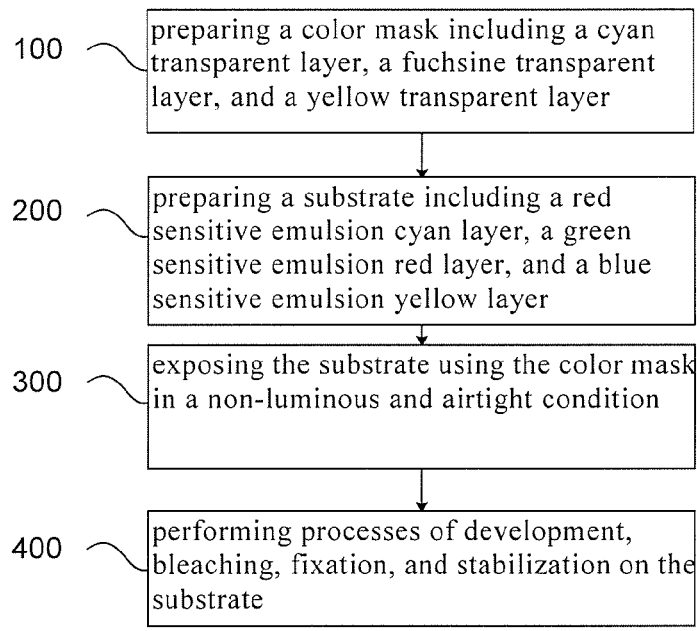
FIG. 1 is a flow chart of a method of manufacturing a color filter substrate according to an embodiment of the invention.

FIG. 1 is a flow chart of an exemplary method of manufacturing a color filter substrate according to an embodiment of the invention. The exemplary method includes the following steps:

step 100, preparing a color mask including a cyan transparent layer, a fuchsine transparent layer, and a yellow transparent layer;

step 200, preparing a color sensitive material substrate including a red sensitive emulsion cyan layer, a green sensitive emulsion fuchsine layer, and a blue sensitive emulsion yellow layer;

step 300, exposing the color sensitive material substrate using the color mask in a non-luminous and airtight condition; and step 400, performing processes of development, bleaching, fixation, and stabilization on the color sensitive material substrate.

The manufacturing method of a color filter substrate according to the embodiment of the invention is based on the imaging principle of color film. First, color sensitive materials for imaging are formed on a second substrate to form a color sensitive material substrate, and the color pattern for the color filter substrate to be formed is formed on a color mask. In a dark room or airtight and non-luminous condition, alignment and exposure are performed and the color pattern on the color mask is transferred onto the color sensitive materials on the second substrate. Then with the processes of development, fixation, and so on, the color pattern for the color filter substrate is formed on the second substrate. Finally, the color filter substrate according to the embodiment of the invention is obtained here. It can be seen that the manufacturing method of the color filter substrate according to the embodiment of the invention can be performed by one time of lithography process, which simplifies the manufacturing process and saves the equipment and material cost. Further, one time of lithography process enhances the color stability of the color filter substrate, so that the critical dimension can be adjusted in a certain range conveniently, and it is possible to increase the manufacturing accuracy, enhance the product quality and product efficiency of the LCD, for example, and decrease the product cost. In the embodiment as shown in FIG. 1, the sequence of step 100 and step 200 may be inversed, that is, the color sensitive material substrate is manufactured at first, and then the color mask is manufactured, or both are manufactured at the same time.

Figure 2:
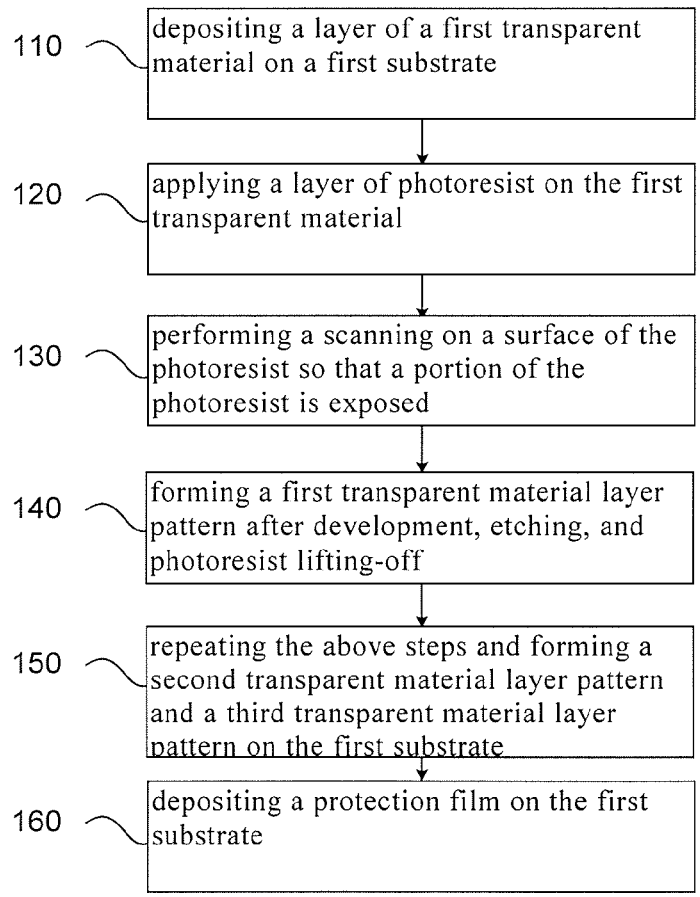
FIG. 2 is a flow chart for manufacturing a color mask according to an embodiment of the invention.

FIG. 2 is a flow chart for manufacturing a color mask according to an embodiment of the invention, including the following steps of:

step 110, depositing a layer of a first transparent material on a first substrate;

step 120, applying a layer of photoresist on the first transparent material;

step 130, performing a line-by-line scanning on the surface of the photoresist using a single beam pulse laser, for example, so that a portion of the photoresist is exposed;

step 140, forming a first transparent material layer pattern after development, etching, and photoresist lifting-off;

step 150, repeating the above steps and forming a second transparent material layer pattern and a third transparent material layer pattern on the first substrate, respectively; and step 160, depositing a protection film on the first substrate after the above steps.

In preparing the color mask, the first transparent material layer may be one of a cyan transparent material layer, a fuchsine transparent material layer, and a yellow transparent material layer, and the second transparent material layer and the third transparent material layer may be the remaining two of the above three layers. The method of preparing the color mask is described below with an example of sequentially forming a cyan transparent material layer, a fuchsine transparent material layer, and a yellow transparent material layer.

Figure 3:
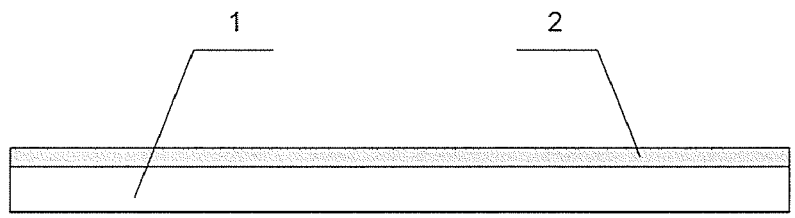
FIG. 3 is a schematic view of depositing a cyan transparent material according to an embodiment of the invention.
Figure 4:
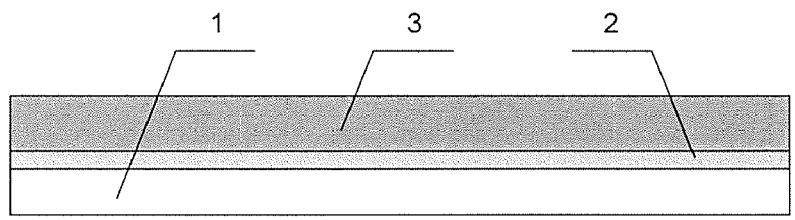
FIG. 4 is a schematic view of applying photoresist according to an embodiment of the invention.
Figure 5:
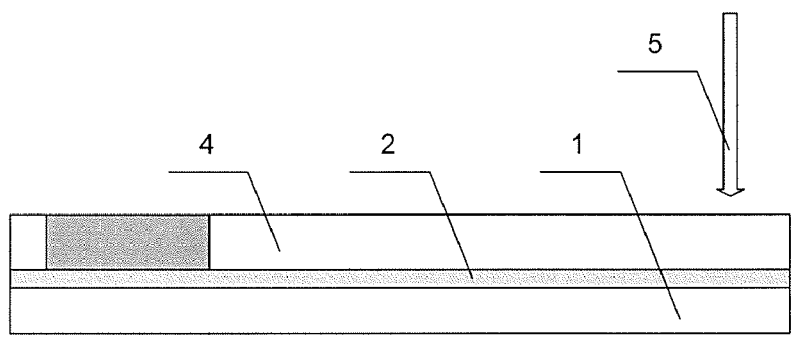
FIG. 5 is a schematic view of exposing a portion of the photoresist according to an embodiment of the invention.
Figure 6:
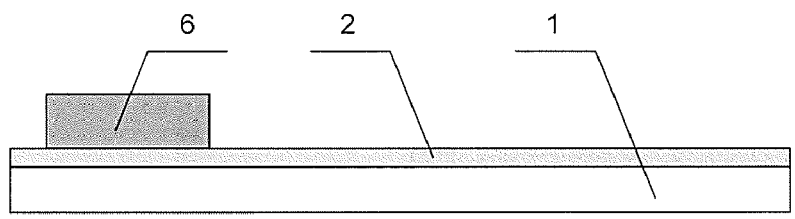
FIG. 6 is a schematic view of development according to an embodiment of the invention.
Figure 7:
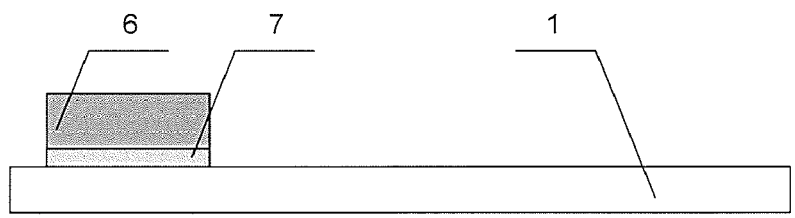
FIG. 7 is a schematic view of etching according to an embodiment of the invention.
Figure 8:
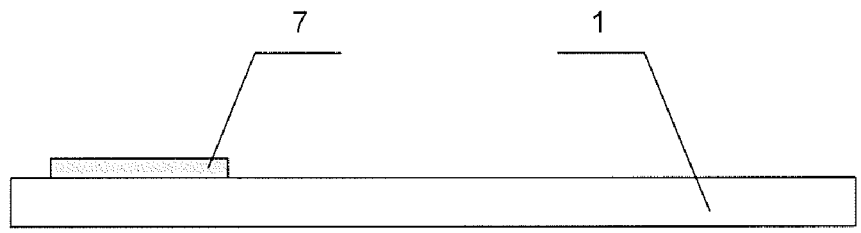
FIG. 8 is a schematic view of lifting-off the photoresist according to an embodiment of the invention.
Figure 9:
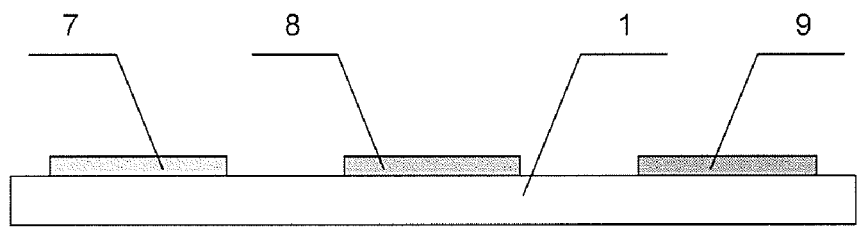
FIG. 9 is a schematic view of forming a fuchsine transparent material and a yellow transparent material according to an embodiment of the invention.
Figure 10:
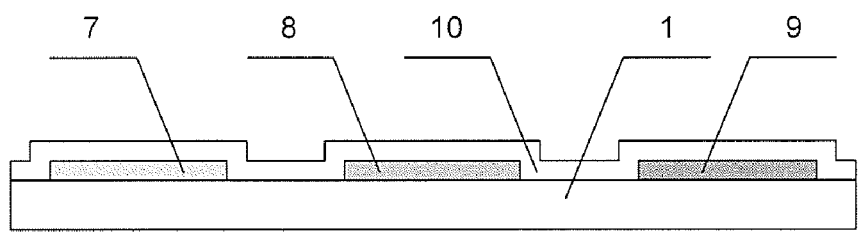
FIG. 10 is a schematic view of depositing a protection film according to an embodiment of the invention.

FIGS. 3 to 10 are schematic views of preparing the color mask according to an embodiment of the invention, in which FIG. 3 is a schematic view of depositing a cyan transparent material, FIG. 4 is a schematic view of applying photoresist, FIG. 5 is a schematic view of exposing a portion of the photoresist, FIG. 6 is a schematic view of development, FIG. 7 is a schematic view of etching, FIG. 8 is a schematic view of lifting-off the photoresist, FIG. 9 is a schematic view of forming a fuchsine transparent material and a yellow transparent material, and FIG. 10 is a schematic view of depositing a protection film.

As shown in FIGS. 3 to 10, at first, a layer of cyan transparent material 2 (RGB: 0, 255, 255) is deposited on a first substrate 1 (for example, a glass substrate) for preparing the color mask, and then on the layer of cyan transparent material 2, a layer of photoresist 3 is applied, and the photoresist 3 may employ positive photoresist or negative photoresist. The positive photoresist is used for description as an example. Under the control of a computer system, a single beam laser 5 scans line-by-line on the surface of the photoresist 3 according to a predetermined design blueprint, so that a portion of the photoresist 3 is exposed, and the pattern on the blueprint is transferred onto the photoresist 4 after exposure. After development, the pattern is completely transferred as photoresist 6. By etching of the layer of cyan transparent material 2, the pattern on the blueprint is transferred as a cyan transparent material layer pattern 7. By photoresist lifting-off, the preparation of the cyan transparent material layer pattern 7 on the color mask is completed, as shown in FIG. 8. By repeating the processes as shown in FIG. 3 to 8, a fuchsine transparent layer (RGB: 255, 0, 255) pattern and a yellow transparent material (RGB: 255, 255, 0) pattern can be formed on the first substrate 1, sequentially. By processes of applying photoresist, exposure, development, etching, and lifting-off, the fuchsine transparent material layer pattern 8 and the yellow transparent material layer pattern 9 are formed on the first substrate 1, as shown in FIG. 9. Finally, a layer of protection film 10 is deposited on the first substrate 1, and the preparation of the color mask according to the embodiment of the invention is completed here. The three patterns 7, 8, and 9 are formed on the first substrate 1 side by side in FIG. 10.

The above embodiment only gives out an exemplary method. In another embodiment of the invention, the position and the preparation sequence of the three transparent material layers on the color mask may be chosen according to design and produce requirements, so that arbitrary combinations of the cyan transparent material layer, the fuchsine transparent material layer and the yellow transparent material layer can be used.

The color sensitive material substrate according to an embodiment of the invention may be formed by the steps of forming a red sensitive emulsion cyan layer, a green sensitive emulsion fuchsine layer, and a blue sensitive emulsion yellow layer on a second substrate sequentially, or a blue sensitive emulsion yellow layer, a red sensitive emulsion cyan layer, and a green sensitive emulsion fuchsine layer on the second substrate sequentially; or a green sensitive emulsion fuchsine layer, a blue sensitive emulsion yellow layer, and a red sensitive emulsion cyan layer on the second substrate sequentially. The above respective layers may be configured differently as necessary. For example, forming of the red sensitive emulsion cyan layer, the green sensitive emulsion fuchsine layer, and the blue sensitive emulsion yellow layer on the second substrate sequentially may comprise forming a backing layer, the red sensitive emulsion cyan layer, a red sensitive mask red layer, a spacer layer, the green sensitive emulsion fuchsine layer, a green sensitive mask yellow layer, a spacer layer, a yellow filter layer, the blue sensitive emulsion yellow layer, and a protection film on the second substrate sequentially.

Figure 11:
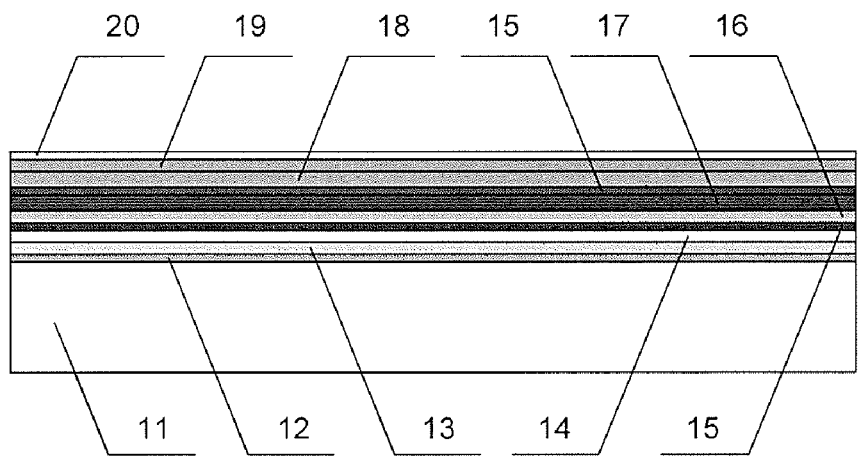
FIG. 11 is a schematic view of preparing a color sensitive material substrate according to an embodiment of the invention.

FIG. 11 is a schematic view of preparing a color sensitive material substrate according to an embodiment of the invention. After a second substrate 11 (e.g., a glass substrate) is cleaned, a backing layer 12, a red sensitive emulsion cyan layer 13, a red sensitive mask red layer 14, a spacer layer 15, a green sensitive emulsion fuchsine layer 16, a green sensitive mask yellow layer 17, a spacer layer 15, a yellow filter layer 18, a blue sensitive emulsion yellow layer 19, and a protection film 20 are applied uniformly in this order. The backing layer 12 functions to enhance the adhesion strength between the second substrate 11 and the red sensitive emulsion cyan layer 13.

The red sensitive emulsion cyan layer 13 can be formed by adding a red sensitive (for example, sensitive to red light of 600 nm~700 nm) dye and a coupler for generating cyan color (RGB: 0, 255,255) into a silver halide emulsion. The coupler is an organic compound material which can couple with the oxide of the developer, and the coupler generally includes an active methylene ($X-CH_2-Y$). The coupler functions to act with the silver in the silver halide after exposure, and so that a complementary image of the layer can be displayed after development. The red sensitive cyan layer 13 shows cyan color (RGB: 0, 255, 255) after exposure, development, and fixation. The red sensitive mask red layer 14 is a relatively weak light filter layer, which can block blue light (RGB: 0, 0, 255) and green light (RGB: 0, 255, 0) irradiated to the red sensitive emulsion cyan layer 13, so that the red sensitive emulsion cyan layer 13 cannot be interfered by light of other colors except red light (RGB: 255, 0, 0) during exposure, and the exposed portion loses the red mask thereon during exposure, and the unexposed portion remains red. The red sensitive emulsion mask red layer 14 normally comprises gelatin, red dye, and colloid silver. The silver particles are very fine and uniformly dispersed in colloid state and can combine with red dye to produce red color. The silver particles are oxidized to form a silver salt when being rinsed (bleached), and the silver salt is dissolved by hypo solution during fixation.

The green sensitive emulsion fuchsine layer 16 can be formed by adding a green sensitive (for example, sensitive to green light of 500 nm~600 nm) dye and a coupler for generating fuchsine color (RGB: 255, 0, 255) into a silver halide emulsion. The green sensitive mask yellow layer 17 is also a light filter layer, which can prevent blue light (RGB: 0, 0, 255) being irradiated into the respective underlying layers, so that the green sensitive emulsion fuchsine layer 16 and the red sensitive emulsion cyan layer 13 cannot be interfered by blue light during exposure, the exposed portion loses the yellow mask during development, and the unexposed portion remains yellow. The spacer layer 15 may comprise a gelatin and an antistain agent or a colorless coupler, preventing cyan fog from being generated due to cross-talk of oxides between adjacent layers. The function of the yellow filter layer 18 is to absorb blue light (RGB: 0, 0, 255) and prevent blue light from being irradiated into underlying emulsion layers. The yellow filter layer 18 may comprise gelatin and colloid silver. The silver particles are very fine and uniformly dispersed in colloid state to produce yellow color. The silver particles are oxidized to form a silver salt when being rinsed (bleached), and the silver salt is dissolved by hypo solution during fixation.

The blue sensitive emulsion yellow layer 19 is a color-blind emulsion and can be formed by adding the blue sensitive (for example, sensitive to blue light of 400 nm~500 nm) dye and a coupler for generating yellow color (RGB: 255, 255,0). The blue sensitive emulsion yellow layer 19 is only sensitive to blue light but not sensitive to green and red light. The uppermost layer is the protection film 20, and the protection film 20 is made of the gelatin, and the like, so as to prevent damages to the light sensitive emulsion layers.

Figure 12:
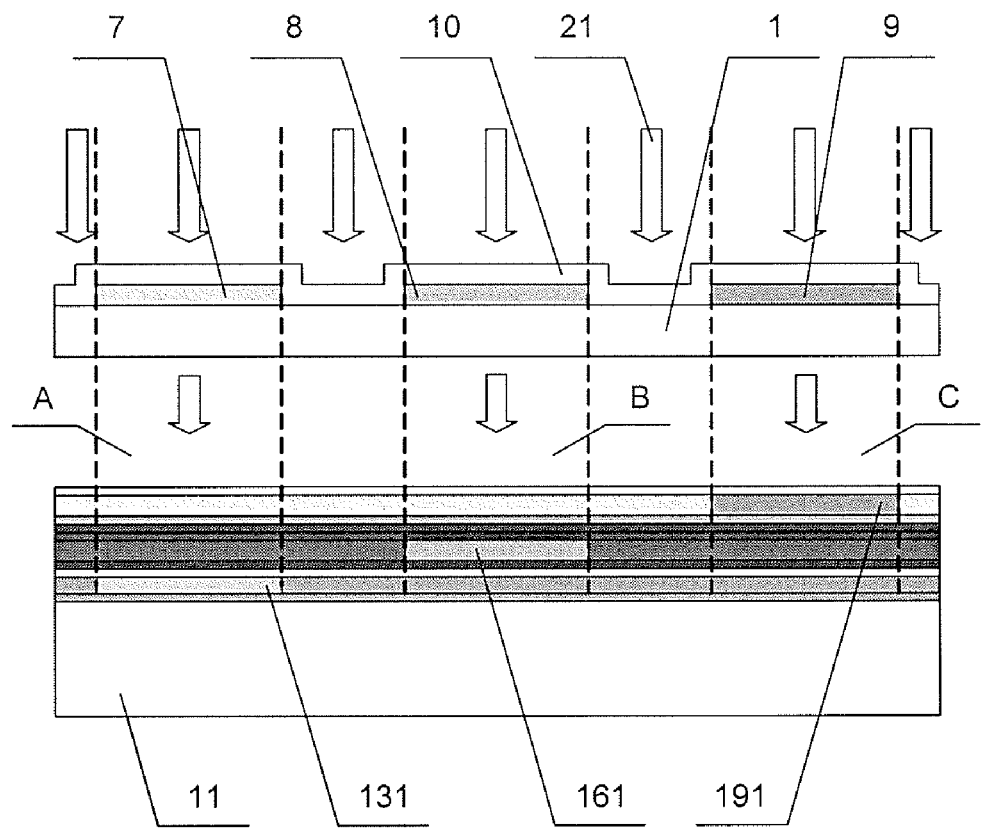
FIG. 12 is a schematic view of exposing the color sensitive material substrate using the color mask according to an embodiment of the invention.

FIG. 12 is a schematic view of exposing the color sensitive material substrate using the color mask according to an embodiment of the invention. In view of the light sensitivity of the light sensitive materials, the alignment and exposure steps can be both performed in a dark room or a non-luminous and airtight environment. Since the embodiment of the invention only includes one time of lithography, the alignment of the color mask and the color sensitive material substrate can be performed with the laser alignment marks, for example, on the color mask and/or the apparatus for carrying the color sensitive material substrate with good directivity. The color mask is used for exposure, and the light source for exposure preferably has good directivity and is a white light with continuous wavelength. A femto second white laser may be used as the exposure light source in the embodiment. The femto second laser generates a continuous wavelength light with non-linear medium, and its frequency varies fast. The femto second laser has the advantages such as emitting light of a continuous wavelength with good directivity. In the embodiment, the femto second white laser may be used as the exposure source and can satisfy the requirement for the exposure of the color mask, and therefore the pattern formed on the color sensitive material substrate can have a sharp boundary after exposure, and the pattern transfer can performed with good repeatability.

As shown in FIG. 12, the color mask and the color sensitive material substrate are aligned, and the color of the pattern on the color mask is complementary with the color of pattern to be formed on the color sensitive material substrate. The red color (RGB: 255, 0, 0) on the color sensitive material substrate corresponds to the cyan color (RGB: 0, 255, 255) on the color mask, the green color (RGB: 0, 255, 0) on the color sensitive material substrate corresponds to the fuchsine color (RGB: 255, 0, 255), and the blue color (RGB: 0, 0, 255) on the color sensitive material substrate corresponds to the yellow color (RGB: 255, 255, 0). The exposure is performed with a femto second white laser 21. The light sensitive material layers on the color sensitive material substrate can be exposed simultaneously, and the variation of the critical dimension of the color sensitive material substrate can be achieved through adjusting the exposure amount at one time.

As shown in FIG. 12, during exposure, the light of the femto second white laser 21 passing through the transparent region (the region except the cyan transparent material layer 7, the fuchsine transparent material layer 8, and the yellow transparent material layer 9) on the color mask remains as white light. Therefore, the blue sensitive emulsion yellow layer 19, the green sensitive emulsion fuchsine layer 16, and the red emulsion cyan layer 13 at the corresponding positions of the color sensitive material substrate are exposed, respectively.

The light of the femto second white laser 21 passing through the cyan transparent material layer 7 is cyan light (RGB: 0, 255, 255). After the cyan light in the region A is irradiated on the color sensitive material substrate, blue light is removed, while the blue sensitive emulsion yellow layer 19 in the region A is exposed. Thereafter, while the yellow filter layer 18 is exposed, blue light in the cyan light is further removed substantially. Finally, the remaining very small amount of blue light is completely removed in the green sensitive emulsion mask yellow layer 17. After the remaining green light is removed partially when passing through the green sensitive emulsion mask yellow layer 17, the green light is removed substantially, while the green sensitive emulsion fuchsine layer 16 in region A is exposed. After the red sensitive emulsion mask red layer 14 further absorbs the remaining very small amount of green light completely, there is no light reaching the red sensitive emulsion cyan layer 13. Therefore, after the exposure, the red sensitive emulsion cyan layer 13 is not exposed only in a red pattern region 131 of the color mask.

The light of the femto second white laser 21 passing through the fuchsine transparent material layer 8 on the color mask is still fuchsine light (RGB: 255, 0, 255). After the fuchsine light in region B is irradiated on the color sensitive material substrate, blue light is removed while the blue sensitive emulsion yellow layer 19 in region B is exposed. After that, blue light in the fuchsine light is further removed substantially, while the yellow filter layer 18 is exposed. Finally, the remaining very small amount of blue light is completely removed in the green sensitive emulsion mask yellow layer 17. Since there is no the green light, the green sensitive emulsion fuchsine layer 16 is not exposed only in a green pattern region 161 on the color mask. Similarly, the lower red sensitive emulsion cyan layer 13 is exposed by the remaining red light.

The light of the femto second white laser 21 passing through the yellow transparent material layer 9 on the color mask is yellow light (RGB: 255, 255, 0). After the yellow light in region C is irradiated on the color sensitive material substrate, since there is no blue light, the blue sensitive emulsion yellow layer 19 is not exposed only in a blue pattern region 191 on the color mask. At the same time, since the color of the light and the yellow filter layer 18 are of the same color, the yellow filter layer 18 in region C is not exposed. Also, the green sensitive emulsion fuchsine layer 16 and the red sensitive fuchsine cyan layer 13 are exposed sequentially when the yellow light passing through them.

Thus, after completion of the exposure, the red sensitive emulsion cyan layer is not exposed only in the red patter region 131 of the color sensitive material substrate, the green sensitive emulsion fuchsine layer is not exposed only in the green pattern region 161 of the color sensitive material substrate, the blue sensitive emulsion yellow layer is not exposed only in the blue pattern region 191 of the color sensitive material substrate, and the yellow filter layer 18 is not exposed only in the blue pattern region 191 of the color sensitive material substrate.

After the light sensitive materials on the color sensitive material substrate are exposed, the main structures of the color filter substrate are formed with the processes of development, bleaching, fixation, and stabilization. During development, the exposed silver halide is first reduced to silver by the color developer. At the same time, the color developer is oxidized to the oxide thereof and makes a coupling reaction with the coupler in the emulsion, so as to generate the dye (color image), and the reaction can be expressed as follows,

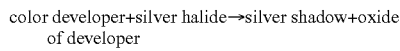
color developer+silver halide→silver shadow+oxide of developer

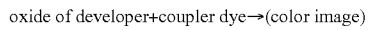
oxide of developer+coupler dye→(color image)

The main compositions of a color developing agent may include a color developer, a protective agent, a development inhibitor releasing coupler (DIR), an antifogging agent, and a softening agent. The color developer may uses p-amino-N,N-diethylaniline hydrochloride developer (TSSCD) (applicable to a water soluble light sensitive material) or color devel-oper-3 (CD3) (applicable to an oil soluble light sensitive material) so as to form the silver shadow. The main compositions of the protective agent may include $Na_2CO_3$, hydroxylamine sulfate ($S_{55}$), and hydroxylamine hydrochloride, and adding small amount of the protective agent can improve the preservation ability of the prepared developing liquid. The protective agent can lead to relatively weak development, so that a portion of exposed silver halide can be reduced to silver. The color developing liquid is prepared as an alkaline solution, so that it can generate intense ionization, that is, generate a large amount of negative ions, so as to have the ability of developing. The color developer has relatively low chemical activity, so it needs relatively strong alkali as an accelerator. The normally used accelerator includes $Na_2CO_3$ or $K_2CO_3$. A small amount of NaOH can be added to $Na_2CO_3$ to increase pH value, or sodium phosphate may be employed. The development inhibitor releasing coupler (DIR) can improve graininess of a formed image and enhance definition of picture. The antifogging agent may be KBr or NaBr. The softening agent can prevent calcium and magnesium ions in water from generating insoluble salt in an alkaline environment that may be deposited on the color filter substrate to generate calcium nets and cause dash. The normally used softening agent may include disodium ethylenediamine tetraacetate (EDTA disodium salt, M23) or sodium hexametaphosphate (M19). The above compositions can be mixed proportionally according to the properties of the color sensitive material substrate applied with the light sensitive materials so as to form a suitable developing agent.

Bleaching can be used to oxidize the reduced silver and the colloid in the yellow filter layer on the color sensitive material substrate to be a silver salt that is soluble in hypo solution. Typically, the potassium ferricyanide or potassium bichromate is used as an oxidant. The antifogging agent (e.g., KBr) may be added to accelerate the reaction, and potassium dihydrogen phosphate (or sodium dihydrogen phosphate) may be added to keep pH value of the bleaching solution. Currently, the integrity of bleaching and fixation can be achieved by using disodium ethylenediamine tetraacetate ferric salt instead of potassium ferricyanide, and thus non-toxic bleaching can be achieved.

Fixation is to dissolve the silver halide, which is not reduced in the light sensitive materials, and to dissolve the silver salt, which is generated during bleaching the silver shadow and the yellow filter layer. A water soluble light sensitive material uses a neutral or alkaline fixation solution, and an oil soluble light sensitive material uses an acidic fixation solution, such as acidic fixation solution F5 (for example, a formulation comprising 600 ml of hot water at 60~70° C., 240 g of crystalline sodium thiosulfate, 15 g of anhydrous sodium sulfite, 45 ml of 30% acetic acid or 14 ml of pure acetic acid, 7.5 g of boric acid, 15 g of potassium alum, and water added to obtain 1000 ml solution finally).

Stabilization process may improve fading characteristic of an image. Fading may occur during preservation of the formed color filter substrate. One of the reasons of fading include that the dye is hydrolyzed, and the remaining coupler in the light sensitive material is oxidized so as to generate a red-yellow oxide, so that the image especially at the low density portion is changed into red tone. Formaldehyde reacts with the coupler remained in the emulsion to generate a substance, which is not easy to be oxidized, so that the preservation of the dye image can be improved. Moisten agent (e.g., alkyl naphthalene sulfonic sodium) may be added into the stabilization agent and can prevent water drops on the base sheet from forming marks during drying the color filter substrate.

Figure 13:
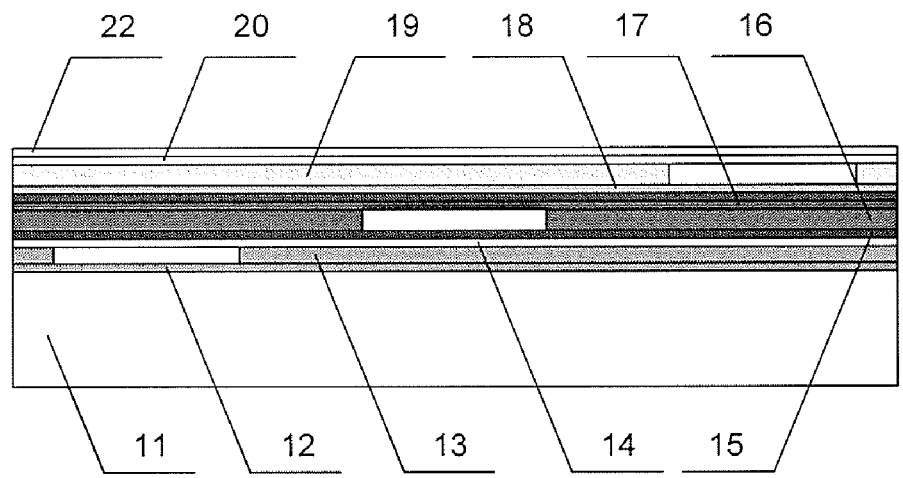
FIG. 13 is a schematic view of preparing an ITO layer according to an embodiment of the invention.

FIG. 13 is a schematic view of preparing an indium tin oxide (ITO) layer according to the embodiment of the invention. The method according to the embodiment of the invention may further include the step of depositing an ITO layer on the color sensitive material substrate. After the above processes of development, bleaching, fixation and stabilization, the deposition of the ITO layer is performed after drying, so as to obtain the main structure of the color filter substrate according to the embodiment of the invention. Since the light sensitive materials on the color sensitive material substrate are mostly formed from organic materials, which mostly cannot endure high temperature, the ITO layer 22 in the embodiment can be formed by magnetic ionic sputtering process at room temperature. The ITO layer has excellent optical property. The ITO layer may be disposed on the color filter substrate (e.g., for a twist nematic (TN) type LCD), or may be disposed on the array substrate (e.g., for a fringe field switching (FFS) type LCD), according to the types of the LCD. Therefore, the color filter substrate of the embodiment is described by taking the application in the TN type LCD as an example.

Furthermore, the above embodiment is only an implementation of the invention, but not the only one. Different materials, processing parameters and equipments can be used in implementation. For example, the following modification may be made. The first light emulsion layer is a blue sensitive emulsion yellow layer, the first light sensitive emulsion mask layer is a blue sensitive emulsion mask blue layer, the second light emulsion layer is a red sensitive emulsion cyan layer, the second light emulsion mask layer is a red sensitive mask fuchsine layer, the third color filter substrate layer is a fuchsine filter layer, and the third light sensitive emulsion layer is a green sensitive emulsion fuchsine layer. Correspondingly, the backing layer, the blue sensitive emulsion yellow layer, the blue sensitive emulsion mask blue layer, the spacer layer, the red sensitive emulsion cyan layer, the red sensitive emulsion mask fuchsine layer, the spacer layer, the fuchsine filter layer, the green sensitive emulsion fuchsine layer and the protection film are formed on a cleaned second substrate in this order. Alternatively, the first light sensitive emulsion layer is a green sensitive emulsion fuchsine layer, the first light sensitive emulsion mask layer is a green sensitive emulsion mask green layer, the second light sensitive emulsion layer is a blue sensitive emulsion yellow layer, the second light sensitive emulsion mask layer is a blue sensitive emulsion mask cyan layer, the third light filter layer is a cyan filter layer, and the third light sensitive emulsion layer is a red sensitive emulsion cyan layer. Correspondingly, the backing layer, the green sensitive emulsion fuchsine layer, the green sensitive emulsion mask green layer, the spacer layer, the blue sensitive emulsion yellow layer, the blue sensitive mask cyan layer, the spacer layer, the cyan filter layer, the red sensitive emulsion cyan layer and the protection film are formed on a cleaned second substrate in this order.

Figure 14:
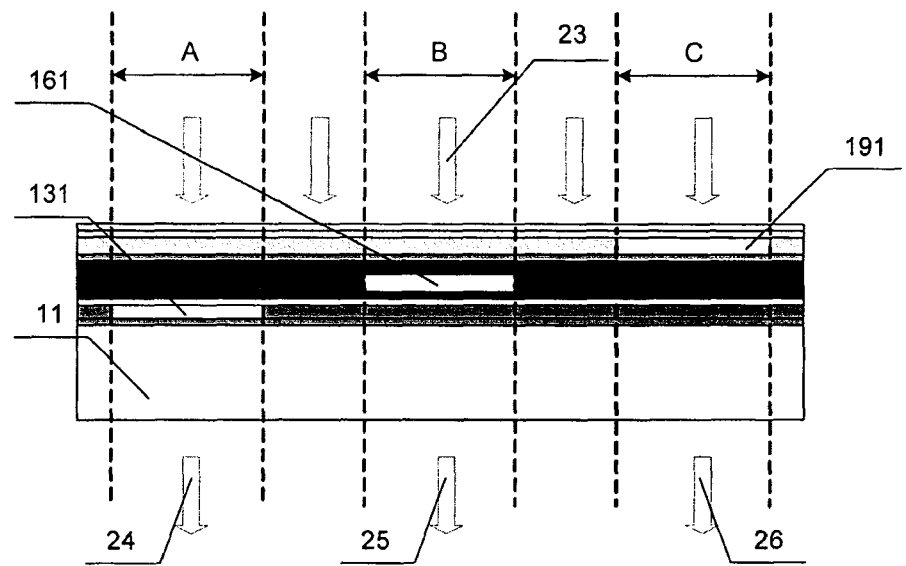
FIG. 14 is a schematic view of using the color filter substrate according to an embodiment of the invention.

FIG. 14 is a schematic view for using the color filter substrate according to an embodiment of the invention. A LCD is constituted with the color filter substrate and an array substrate with a liquid crystal layer therebetween. In use, a white polarized light 23 is irradiated from the array substrate to the color filter substrate according to the embodiment of the invention. Green light and blue light are absorbed in region A when the white polarized light passes through the exposed green sensitive emulsion fuchsine layer and the exposed blue sensitive emulsion yellow layer, and only red light passes through the unexposed red pattern region 131 in the blue sensitive cyan layer, that is, only red light 24 passes through the color filter substrate, so that the region A is a red transparent region. Similarly, blue light and red light are absorbed in region B when the white polarized light 23 passes through the exposed blue sensitive emulsion yellow layer and the exposed red sensitive emulsion cyan layer, and only green light passes through the unexposed green transparent region 161 in the green sensitive emulsion fuchsine layer, that is, only green light 25 passes through the color filter substrate, so that region B is a green transparent region. Green light and red light are absorbed in region C when the white polarized light 23 passes through the exposed green sensitive emulsion fuchsine layer and the exposed red sensitive emulsion cyan layer, and only blue light passes through the unexposed blue patter region 191 in the blue sensitive emulsion yellow layer, that is, only blue light 26 passes through the color filter substrate, so that the region C is a blue transparent region. The light passes through a polarization film, and constitutes the color image for display on the view side of the LCD.

Since the blue sensitive emulsion yellow layer 19 and the green sensitive emulsion fuchsine layer 16 in region A have been exposed and take on yellow and fuchsine colors, respectively, after the processes of development, bleaching, fixation and stabilization. Therefore, blue light is absorbed when the white polarized light in region A passes through the exposed blue sensitive emulsion yellow layer 19, and the green light is absorbed when the white polarized light passes through the exposed green sensitive emulsion fuchsine layer 16, and only the red light can pass through the unexposed red pattern region 131 in the red sensitive emulsion cyan layer 13. Since the yellow filter has been exposed and takes on the yellow color after the processes of development, bleaching, fixation, and stabilization, it only absorbs blue light, and therefore, the transmission of the red light is not influenced. Since the blue sensitive emulsion yellow layer 19 and the red sensitive emulsion cyan layer 13 in region B have been exposed and take on the yellow and cyan colors, respectively, after the processes of development, bleaching, fixation and stabilization. Therefore, blue light is absorbed when the white polarized light in region B passes through the exposed blue sensitive emulsion yellow layer 19, red light is absorbed when the white polarized light passes through the exposed red sensitive emulsion cyan layer 13, and only green light can pass through the unexposed pattern region 161 in the green sensitive emulsion fuchsine layer 16. Since the yellow filter layer 18 has also been exposed and takes on yellow color after the processes of development, bleaching, fixation and stabilization, and it only absorbs blue light and therefore does not influence the transmission of green light. Since the green sensitive emulsion fuchsine layer 16 and the red sensitive emulsion cyan layer 13 in region C are exposed and take on the red and cyan colors, respectively, after the processes of development, bleaching, fixation and stabilization. Since the yellow filter layer 18 in region C is not exposed, it is transparent after the processes of development, bleaching, fixation and stabilization, and therefore the transmission of the lights of any color is not influenced. Therefore, green light is absorbed when the white polarized light in region C passes through the exposed green sensitive emulsion fuchsine layer 16, the red light is absorbed when the white polarized light passes through the exposed red sensitive emulsion cyan layer 13, and only blue light can pass through the unexposed blue pattern region 191 in the blue sensitive emulsion yellow layer 19.

It can be seen from the above that, in the method according to the embodiment of the invention, a color filter substrate is manufactured with one time of lithography by employing a femto second white laser, masking, and color film imaging. The method not only simplifies the manufacturing process and saves the equipment and the material, but also enhances the color stability of the color filter substrate, so that the critical dimension can be adjusted in a certain range conveniently and the manufacturing accuracy can be further increased. In addition, since the surface of the prepared color filter substrate is flat and the light transmittance is uniform, the bonding process is easy to be controlled, the product quality of LCDs and the manufacturing efficiency can be increased. Also, the product cost can be decreased.

Figure 15:
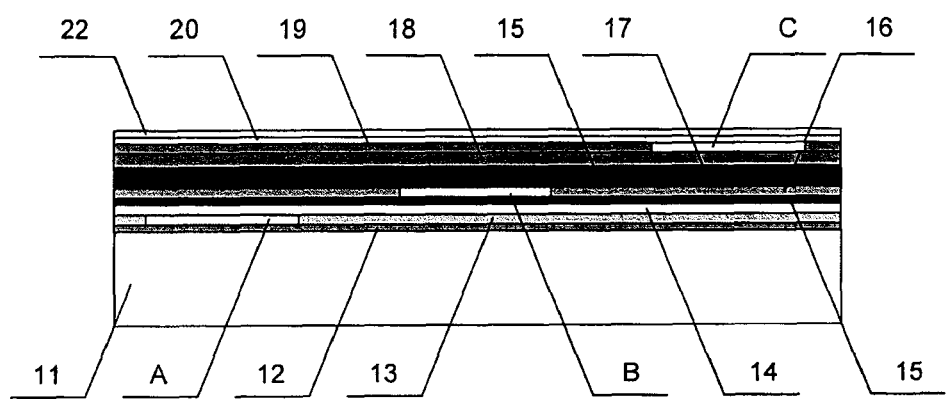
FIG. 15 is a schematic structural view of the color filter substrate according to an embodiment of the invention.

FIG. 15 is a structural schematic view of the color filter substrate according to the embodiment of the invention. As shown in FIG. 15, the color filter substrate prepared by the above manufacturing method includes the second substrate 11 and the three light sensitive emulsion layers formed on the second substrate 11 sequentially. The three light sensitive emulsion layers include the red sensitive emulsion cyan layer 13, the green sensitive emulsion fuchsine layer 16, and the blue sensitive emulsion yellow layer 19, which are formed on the second substrate (e.g., a glass substrate) 11 in this order, respectively. After the processes of exposure, development, bleaching, fixation and stabilization, three transparent regions are formed respectively, which include the red transparent region A, the green transparent region B, and the blue transparent region C. Each transparent region only permits the light of one color to transmit. In particular, the red transparent region A comprises the unexposed red sensitive emulsion cyan layer, the exposed green sensitive emulsion fuchsine layer, and the blue sensitive emulsion yellow layer, for absorbing blue and green light when the white polarized light is irradiated and permitting red light to transmit. The green transparent region B comprises the unexposed green sensitive emulsion fuchsine layer, the exposed blue sensitive emulsion yellow layer, and the red sensitive emulsion cyan layer, for absorbing blue and red light when the white polarized light is irradiated and permitting green light to transmit. The blue transparent region C comprises the unexposed blue sensitive emulsion yellow layer, and the exposed green emulsion fuchsine layer, and the red sensitive emulsion cyan layer, for absorbing green and red light when the white polarized light is irradiated and permitting blue light to transmit. Since the colors of the regions of the color filter substrate are generated with corresponding light sensitive materials, the colors cannot be influenced by the dye and have good color stability.

In the above color filter substrate according to the embodiment of the invention, the red sensitive emulsion cyan layer 13, the green sensitive emulsion fuchsine layer 16, and the blue sensitive emulsion yellow layer 19 may be configured differently as necessary. The backing layer 12, the red sensitive emulsion cyan layer 13, the red sensitive mask red layer 14, the spacer layer 15, the green sensitive emulsion fuchsine layer 16, the green sensitive mask yellow layer 17, the spacer layer 15, the yellow filter layer 18, the blue sensitive emulsion yellow layer 19 and the protection film 20 are disposed on the second substrate 11 sequentially, as a configuration of the red sensitive emulsion cyan layer, the green sensitive emulsion fuchsine layer and the blue sensitive emulsion yellow layer. The backing layer, the blue sensitive emulsion yellow layer, the blue sensitive mask blue layer, the spacer layer, the red sensitive emulsion cyan layer, the red sensitive mask red layer, the spacer layer, the fuchsine filter layer, the green sensitive emulsion fuchsine layer, and the protection film are disposed on the second substrate sequentially, as another configuration of the red sensitive emulsion cyan layer, the green sensitive emulsion fuchsine layer and the blue sensitive emulsion yellow layer. The backing layer, the green sensitive emulsion fuchsine layer, the green sensitive mask green layer, the spacer layer, the blue sensitive emulsion yellow layer, the blue sensitive mask cyan layer, the spacer layer 15, the cyan filter layer, the red sensitive emulsion cyan layer and the protection film are disposed on the second substrate sequentially, as another configuration of the red sensitive emulsion cyan layer, the green sensitive emulsion fuchsine layer and the blue sensitive emulsion yellow layer.

The backing layer is to enhance the adhesive strength between the second substrate and the adjacent lowermost light sensitive emulsion layer. The spacer layer comprises gelatin and antistaining agent or colorless coupler for preventing cyan fog due to cross-talk of the oxides in adjacent layers. The protection film comprises gelatin and the like for preventing damages to the light sensitive emulsion layer. In addition, the composition and function of the other respective layers have been described in detail, and the description is not repeated for simplicity.

The color filter substrate and the manufacturing method thereof according to the embodiment of the invention can also be used for other type of displays, for example, organic light emitting display (OLED).

The color filter substrate may further include an ITO layer, and the ITO layer is formed on the uppermost one of the three light sensitive emulsion layers and covers the whole second substrate. It should be noted that the ITO layer may be disposed on the color filter substrate (e.g., TN type), or it may be disposed on the array substrate (e.g., FFS type) according to the types of the LCD. The color filter substrate is for a TN type liquid crystal display as an example, in the above embodiment.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A method of manufacturing a color filter substrate, comprising the steps of:
    preparing a color mask including a cyan transparent layer, a fuchsine transparent layer, and a yellow transparent layer, wherein the cyan transparent layer, the fuchsine transparent layer, and the yellow transparent layer do not overlap with one another on the color mask;
    preparing a color sensitive material substrate including a red sensitive emulsion cyan layer, a green sensitive emulsion fuchsine layer, and a blue sensitive emulsion yellow layer by forming a backing layer, the red sensitive emulsion cyan layer, a red sensitive mask red layer, a first spacer layer, the green sensitive emulsion fuchsine layer, a green sensitive mask yellow layer, a second spacer layer, a yellow filter layer, the blue sensitive emulsion yellow layer, and a protection film on the second substrate sequentially, which layers are stacked together, wherein the red sensitive mask red layer is capable of blocking blue light and green light from being irradiated to the red sensitive emulsion cyan layer, and the green sensitive mask yellow layer is capable of preventing blue light from being irradiated into the underlaying layers;
    exposing the stacked layers of the backing layer, the red sensitive emulsion cyan layer, the red sensitive mask red layer, the first spacer layer, the green sensitive emulsion fuchsine layer, the green sensitive mask yellow layer, the second spacer layer, the yellow filter layer, the blue sensitive emulsion yellow layer, and the protection film of the color sensitive material substrate by using the color mask by using a femto second white laser and then removing the color mask from the color sensitive material substrate; and performing processes of development, bleaching, fixation, and stabilization on the color sensitive material substrate to obtain red transparent regions, green transparent regions and blue transparent regions in an array.

2. The method of claim 1, wherein said preparing a color mask including a cyan transparent layer, a fuchsine transparent layer, and a yellow transparent layer comprises the steps of:

depositing a layer of a first transparent material on a first substrate;

applying a layer of photoresist on the first transparent material;

performing a scanning on a surface of the photoresist so that a portion of the photoresist is exposed;

forming a first transparent material layer pattern after development, etching, and photoresist lifting-off;

repeating the above steps and forming a second transparent material layer pattern and a third transparent material layer pattern on the first substrate, sequentially; and depositing a protection film on the first substrate after the above steps.

3. The method of claim 2, wherein the first transparent material and the second transparent material and the third transparent material are a combination of a cyan transparent material, a fuchsine transparent layer and a yellow transparent layer.

4. The method of claim 1, wherein said exposing the color sensitive material substrate using the color mask comprises:

aligning the color mask and the color sensitive material substrate, and exposing the color sensitive material substrate using a femto second white laser.

5. The method of claim 1, further comprising the step of:

depositing a indium tin oxide (ITO) layer on the color sensitive material substrate.

6. The method of claim 5, wherein the ITO layer is deposited at the room temperature by using magnetic ion sputtering process.

* * * * *